United States Patent
Scaringella et al.

(10) Patent No.: US 10,453,991 B2
(45) Date of Patent: Oct. 22, 2019

(54) LIGHT-EMITTING DEVICE COMPRISING ACTIVE NANOWIRES AND CONTACT NANOWIRES AND METHOD OF FABRICATION

(71) Applicant: ALEDIA, Grenoble (FR)

(72) Inventors: Sylvia Scaringella, Eybens (FR); Philippe Gilet, Teche (FR); Xavier Hugon, Teche/Vinay (FR); Philippe Gibert, Saint Etienne de Crossey (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 14/780,545

(22) PCT Filed: Mar. 28, 2014

(86) PCT No.: PCT/EP2014/056330
§ 371 (c)(1),
(2) Date: Sep. 27, 2015

(87) PCT Pub. No.: WO2014/154880
PCT Pub. Date: Oct. 2, 2014

(65) Prior Publication Data
US 2016/0056330 A1 Feb. 25, 2016

(30) Foreign Application Priority Data
Mar. 28, 2013 (FR) ..................... 13 52805

(51) Int. Cl.
*H01L 33/08* (2010.01)
*H01L 33/62* (2010.01)
(Continued)

(52) U.S. Cl.
CPC .............. *H01L 33/06* (2013.01); *B82Y 20/00* (2013.01); *H01L 24/03* (2013.01); *H01L 24/05* (2013.01);
(Continued)

(58) Field of Classification Search
CPC ......... H01L 33/08; H01L 33/24; H01L 33/38; H01L 27/156; H01L 33/42; H01L 33/62;
(Continued)

(56) References Cited

U.S. PATENT DOCUMENTS 8,350,251 B1 1/2013 Lowgren et al.
2007/0041214 A1* 2/2007 Ha ..................... H01L 33/0079
362/612
(Continued)

FOREIGN PATENT DOCUMENTS

EP 2 290 710 A1 3/2011
JP 2004-319617 A 11/2004
(Continued)

OTHER PUBLICATIONS

Notice of Rejection in Japanese in Patent Application No. 2016-504699, dated Jan. 9, 2018.

*Primary Examiner* — Yu Chen
(74) *Attorney, Agent, or Firm* — Baker & Hostetler LLP

(57) ABSTRACT

A light-emitting device comprises a set of nanowires over the whole surface of a substrate, comprising at least a first series of first nanowires and a second series of second nanowires; the first series comprising first nanowires emitting light under electrical control, connected between a first and a second type of electrical contact to emit light under electrical control, the first nanowires covered by at least one conducting layer transparent at the wavelength of the light-emitting device, layer in contact with the first type of electrical contact; the second series comprising second nanowires, encapsulated in a layer of metal allowing the first electrical contact to be formed; the second electrical contact being on the back face of the substrate, opposite to the face comprising the nanowires, and provided by a conducting layer facing the first series of nanowires. A method of fabrication of the light-emitting device is provided.

14 Claims, 12 Drawing Sheets

(51) Int. Cl.
*H01L 33/42* (2010.01)
*H01L 33/38* (2010.01)
*H01L 33/06* (2010.01)
*B82Y 20/00* (2011.01)
*H01L 33/18* (2010.01)
*H01L 23/00* (2006.01)
*H01L 33/32* (2010.01)
*H01L 33/54* (2010.01)
*H01L 33/60* (2010.01)
*H01L 33/24* (2010.01)

(52) U.S. Cl.
CPC .............. *H01L 33/08* (2013.01); *H01L 33/18* (2013.01); *H01L 33/32* (2013.01); *H01L 33/38* (2013.01); *H01L 33/42* (2013.01); *H01L 33/54* (2013.01); *H01L 33/60* (2013.01); *H01L 33/62* (2013.01); *H01L 33/24* (2013.01); *H01L 2224/04042* (2013.01); *H01L 2224/05018* (2013.01); *H01L 2224/05078* (2013.01); *H01L 2224/48091* (2013.01); *H01L 2224/48464* (2013.01); *H01L 2224/73265* (2013.01); *H01L 2933/005* (2013.01); *H01L 2933/0016* (2013.01); *H01L 2933/0058* (2013.01); *H01L 2933/0066* (2013.01)

(58) Field of Classification Search
CPC ..... H01L 2933/0066; H01L 2933/0016; H01L 2224/05018; H01L 2224/05078; H01L 2224/0508–2224/05098; H01L 2224/04042; H01L 2224/0401; B82Y 20/00

See application file for complete search history.

(56) References Cited

U.S. PATENT DOCUMENTS

| | | | |
|---|---|---|---|
| 2010/0193811 | A1 | 8/2010 | Kao et al. |
| 2011/0062453 | A1* | 3/2011 | Armitage .......... H01L 21/02381 257/79 |
| 2011/0163292 | A1 | 7/2011 | Wang et al. |
| 2011/0240959 | A1 | 10/2011 | Konsek et al. |
| 2011/0309382 | A1 | 12/2011 | Lowgren |
| 2012/0168613 | A1 | 7/2012 | Yu et al. |
| 2012/0223289 | A1 | 9/2012 | Gwo et al. |
| 2014/0117307 | A1* | 5/2014 | Herner ................ H01L 33/0095 257/13 |

FOREIGN PATENT DOCUMENTS

| | | |
|---|---|---|
| JP | 2007-043045 A | 2/2007 |
| JP | 2008-108757 A | 5/2008 |
| JP | 2008-244302 A | 10/2008 |
| JP | 2011-527519 A | 10/2011 |
| JP | 2013-502715 A | 1/2013 |
| WO | 2010/014032 A1 | 2/2010 |
| WO | 2011/160051 A2 | 12/2011 |
| WO | 2012/060335 A | 5/2012 |
| WO | 2012-513115 A | 6/2012 |
| WO | 2012/156620 A2 | 11/2012 |

* cited by examiner

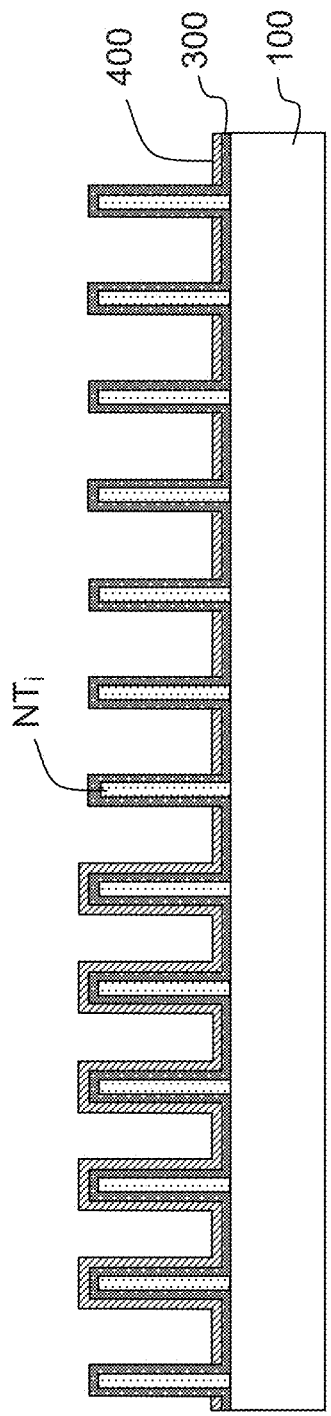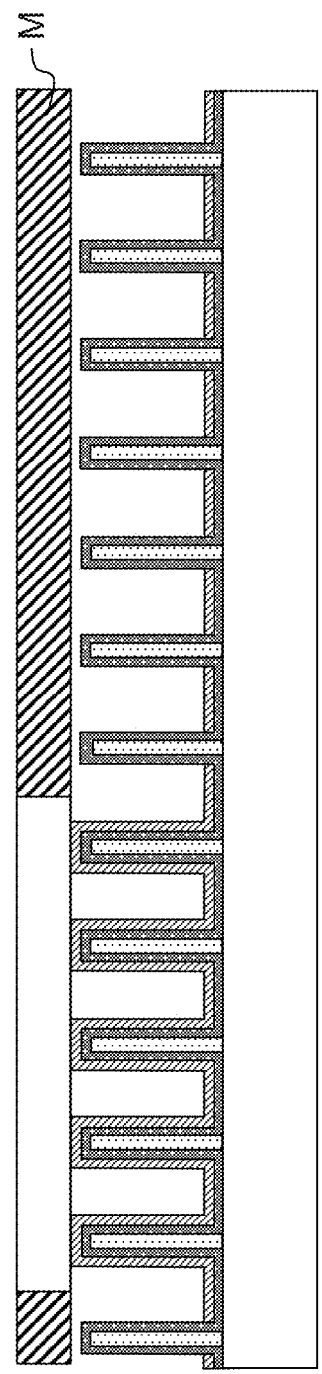
FIG.7a
FIG.7b

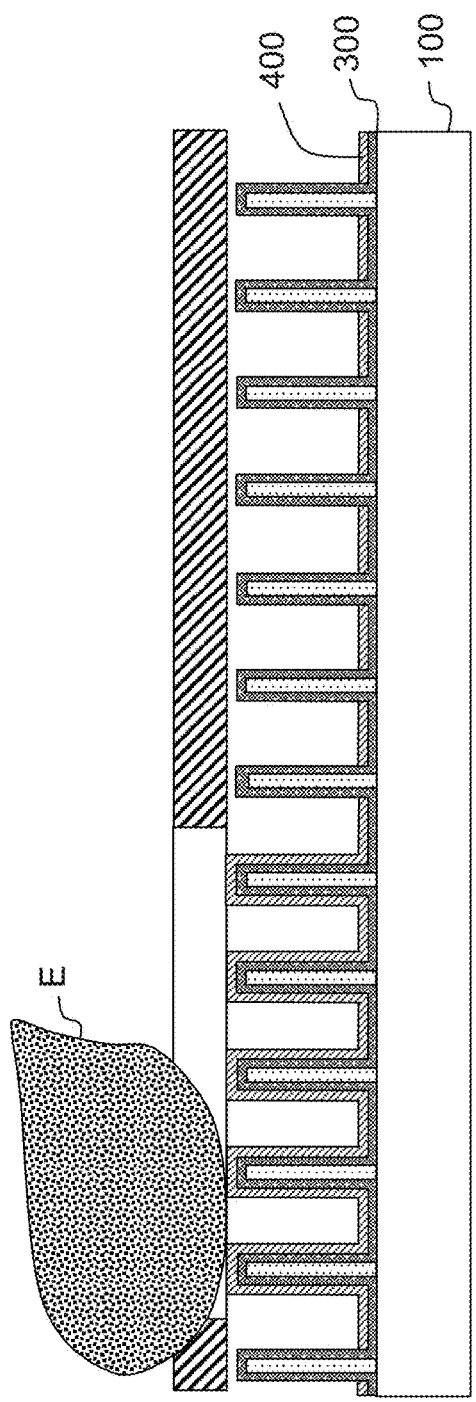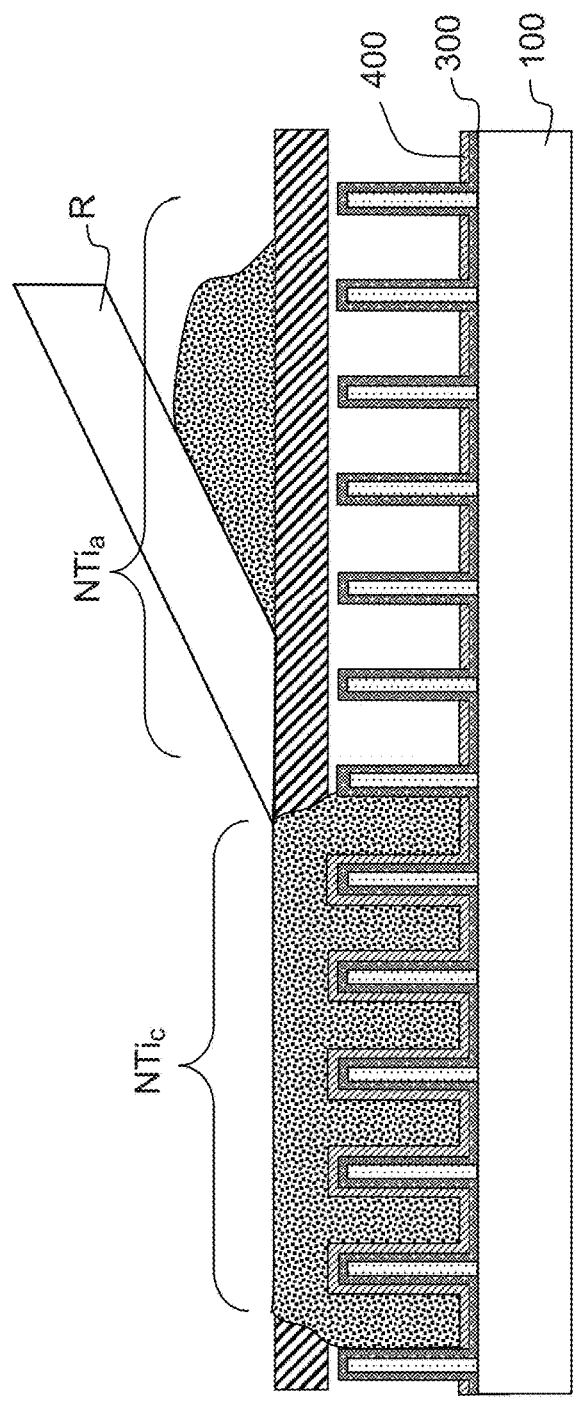

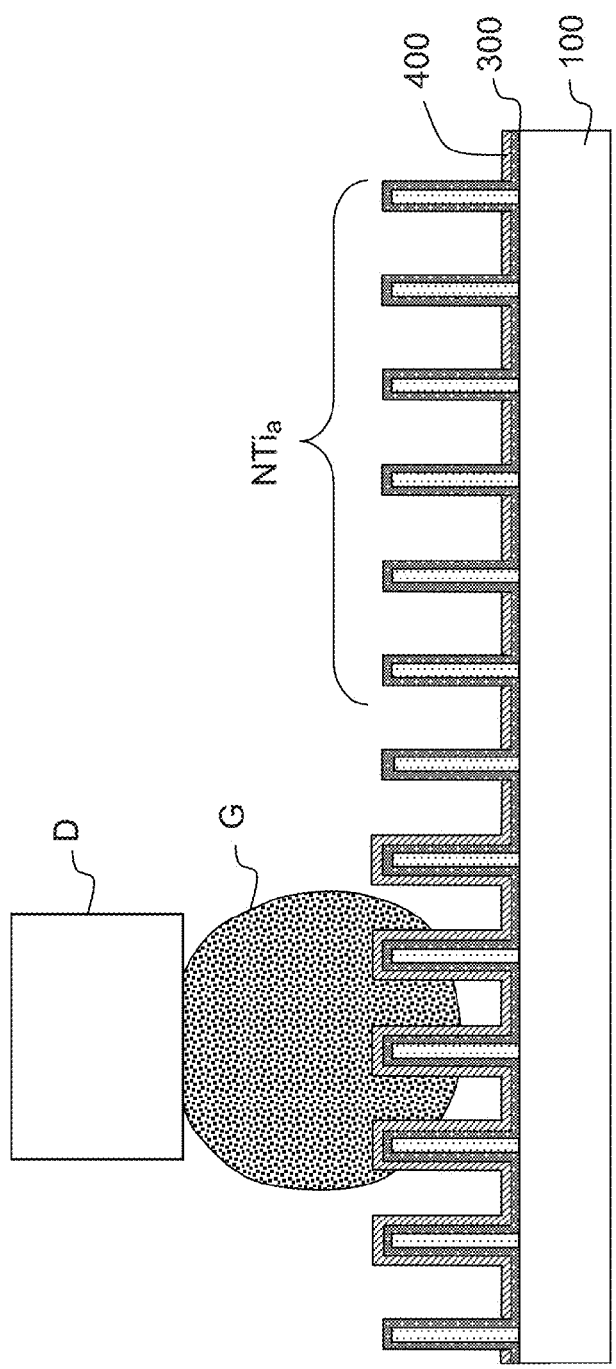
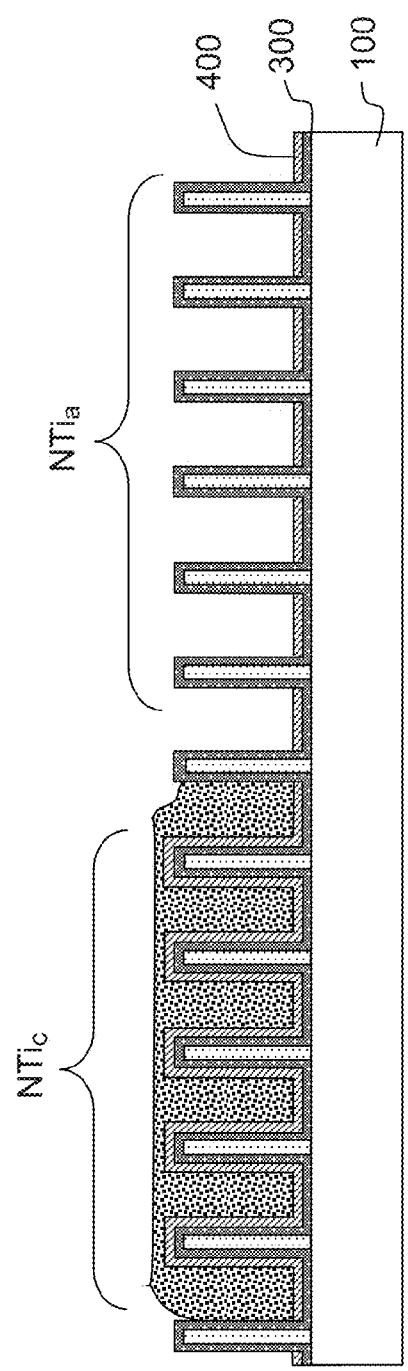

LIGHT-EMITTING DEVICE COMPRISING ACTIVE NANOWIRES AND CONTACT NANOWIRES AND METHOD OF FABRICATION

CROSS-REFERENCE TO RELATED APPLICATIONS

This application is a National Stage of International patent application PCT/EP2014/056330, filed on Mar. 28, 2014, which claims priority to foreign French patent application No. FR 1352805, filed on Mar. 28, 2013, the disclosures of which are incorporated by reference in their entirety.

FIELD OF INVENTION

The field of the invention is that of components containing nanowires, formed collectively by localized growth on a substrate which may be made of silicon, or of GaN or of sapphire, or another material.

More precisely, the field of the invention can relate to components containing photoconducting or light-emitting nanowires that may be used for example to produce light, notably light-emitting diodes, commonly denoted by the acronym LED. Typically, nanowires generally have lateral dimensions (diameter) that can be of the order of a few hundred nanometers and a vertical dimension that can vary up to around ten micrometers, with a ratio height/diameter going from 1 to 30 and typically around 10.

BACKGROUND

During the past few years, visible light-emitting diodes (LEDs) using vertical InGaN/GaN nanowires have for example been fabricated, containing a p-n junction and collectively connected in parallel.

Thanks to their potential intrinsic properties (good crystalline quality, relaxation of the stresses on the free vertical surfaces, good efficiency of extraction of the light, etc.), nanowires are considered as very interesting candidates for overcoming the difficulties currently encountered with conventional GaN LEDs fabricated in a planar structure (2D).

Two nanowire LED approaches, based on different growth techniques, have already been provided and are known to those skilled in the art.

The first approach consists in epitaxially growing GaN nanowires containing InGaN quantum wells in an axial configuration using Molecular Beam Epitaxy (MBE). The devices fabricated using these nanowires have produced interesting results in the green spectral range. The processed chips of 1 mm$^2$ can emit around 10 µW at 550 nm for a continuous operating current of 100 mA.

FIG. 1 illustrates such a configuration showing nanowires $NT_i$ on the surface of a substrate 11, typically made of silicon, in contact with a lower contact of the n type 10, the upper contact of the p type being provided by a transparent layer 12 and the contact being made via a thick p contact pad 13. The nanowires $NT_i$ with an axial structure comprise an n-doped region that can typically be formed from n-doped GaN, an active region ZA made of InGaN or having a structure with quantum wells, and a p-doped region that can be formed from p-doped GaN.

With the molecular beam growth (MBE) technique, some non-uniformities appear owing to random nucleation mechanisms, but typically an optical power on a single wire emitting at 550 nm of 50 nW has been obtained, this being 5 W/mm$^2$ with around a hundred nanowire emitters/mm$^2$.

More recently, the MOCVD (metal-organic chemical vapor deposition) growth technique has enabled the formation of InGaN/GaN nanowires containing a radial LED structure (Core/Shell configuration).

FIG. 2 illustrates this type of configuration in which nanowires $NT_i$ are formed on the surface of a substrate 11 covered by a nucleation layer 21, a lower contact layer 10 also being provided. The localized epitaxy takes place through a mask 20. The structure of the nanowires is of the core/shell type. The core 30 can comprise an n-doped GaN material, typically with a doping level of $10^{19}$ cm$^{-3}$, a quantum well structure with alternating layers, which can respectively be of non-doped GaN and InGaN, and finally a shell 31 which can be composed of a p-doped GaN layer typically with a doping level of $10^{19}$ cm$^{-3}$.

A dielectric layer 40 provides the isolation between the lower and upper contacts.

The upper contact is provided via an upper layer 50, which is conductive and transparent at the emission wavelength of the photoconductive structure. A metal contact layer 60 is also included in order to provide a mirror function.

In this approach, since the structure LED uses a Core/Shell configuration, the surface area of the active region is greater than in a 2D nanowire LED approach comprising planar structures.

Nevertheless, the applicant started from the observation that epitaxial processes, such as the MOCVD process, because of the consumption of all the gaseous species, generate edge effects detrimental to obtaining uniform components, and discontinuities in the regions of growth of the nanowires, more precisely, a variation over the wafer of the growth surface area fraction.

Indeed, notably in the case of LEDs, the nanowires fabricated by epitaxy for example of GaN on growth patterns may be defined by the standard techniques of microelectronics.

These patterns are assembled on the substrate in the form of regular patterns in regions that are compact, square, round, hexagonal, triangular, etc. which define the active surface of the LED. These regions have dimensions defined by the needs of the final user of the product, for example 100 µm by 100 µm, 350 µm by 350 µm, 1 mm by 1 mm, 3.5 mm by 3.5 mm, 10 mm by 10 mm. Each growth region is separated from its neighbor by a spacing whose dimension is adjusted to at least allow the passage of the metal power supply connections for the LEDs and the dicing by sawing of the substrates, or another dicing technique.

These spacings between the growth regions, in which no epitaxy is desired, cause the appearance of multiple defects:

non-uniformities in heights and in morphologies, in the networks of wires, associated with the discontinuities in the growth regions;

unorganized growths of nano-crystals for example of GaN which are killer defects for the circuits at the end of the technological steps;

spurious depositions of InGaN which cover the surfaces of the wafers with conducting materials.

FIG. 3 shows a view taken of a set of nanowires and an array of defects appearing in the regions with no growth, which photograph was taken on a scanning electron microscope, which highlights spurious growths $Cr_{pa}$, depositions of residues of growth $R_{cr}$ and/or walls of nanowires with non-uniform dimensions around the periphery.

A solution may advantageously be envisioned notably allowing the defects to be eliminated by rendering the entire surface of a substrate uniform in terms of growth of nanowires and by selecting an elementary region of nanowires from amongst the larger set of nanowires, thus providing a functional support having uniform nanowires and while at the same time carrying out the selective elimination of certain nanowires in order to notably clear areas dedicated to ohmic contacts. Nevertheless, the removal of sub-assemblies of nanowires may prove to be tricky to implement between sub-assemblies of nanowires to be conserved.

SUMMARY OF THE INVENTION

It is for this reason, and in this context, that the present invention provides LEDs comprising nanowires over the whole of the substrate and the formation of ohmic contacts by virtue of the presence of thick metal on top of some of the previously generated nanowires, allowing at the same time a part referred to as active part of the nanowires to be electrically controlled.

More precisely, one subject of the present invention is a light-emitting device comprising a set of nanowires over the whole surface of a substrate, characterized in that:

it comprises at least a first series of first nanowires and a second series of second nanowires;

said first series comprising first nanowires, referred to as active, capable of emitting light under electrical control, connected between a first type of electrical contact and a second type of electrical contact in order to allow said device to emit light under electrical control, said first nanowires being covered by at least one conducting layer being transparent at the emission wavelength of said light-emitting device, said layer being in contact with said first type of electrical contact;

said second series comprising second nanowires, referred to as contact nanowires, encapsulated within a layer of metal allowing said first type of electrical contact to be formed;

the second type of electrical contact being situated on the back face of said substrate, opposite to the face comprising said nanowires and being provided by a conducting layer at least facing said first series of nanowires.

According to one variant of the invention, said second nanowires are situated around the periphery of said first nanowires.

According to one variant of the invention, said second nanowires are covered by said conducting layer being transparent at the emission wavelength of said light-emitting device.

According to one variant of the invention, the light-emitting device comprises a third series of third nanowires, referred to as electrically neutral, without a conducting layer being transparent at the emission wavelength of said light-emitting device, said third nanowires being able to be situated around the periphery of said first active nanowires and of said second nanowires, defining a region of said device referred to as active.

According to one variant of the invention, the thickness of the layer of metal defined on top of said second nanowires is of the order of at least a few tens of nanometers.

According to one variant of the invention, the light-emitting device comprises a conducting layer being transparent at the emission wavelength of said light-emitting device, which may be made of an oxide of indium and tin (ITO), or of an oxide of zinc doped with aluminum (AZO), or of an oxide of zinc doped with gallium (GZO) or of an oxide of tin doped with fluorine (FTO).

According to one variant of the invention, the layer of metal encapsulating said second nanowires is made of copper or of nickel or of silver.

According to one variant of the invention, the light-emitting device comprises metal contact lugs on the surface of said layer of metal, which lugs may be made of gold or of an alloy of silver and tin.

According to one variant of the invention, said second nanowires are covered by a continuous or discontinuous adhesion layer for the metal, which layer may be of copper or of aluminum.

According to one variant of the invention, the light-emitting device comprises a discontinuous layer of insulator encapsulating the base of said nanowires and being situated on the surface of said substrate between said nanowires.

According to one variant of the invention, the light-emitting device comprises a mirror layer, situated between two adjacent nanowires, which layer may be of Al or of Ag or of Ru.

Another subject of the invention is a method of fabrication of light-emitting devices comprising:

a set of nanowires over the whole surface of a substrate;

at least a first series of first nanowires and a second series of second nanowires;

said first series comprising first nanowires, referred to as active, capable of emitting light under electrical control, connected between a first type of electrical contact and a second type of electrical contact in order to allow said device to emit light under electrical control, said first nanowires being covered by at least one conducting layer being transparent at the emission wavelength of said light-emitting device, said layer being in contact with said first type of electrical contact;

said second series comprising second nanowires, referred to as contact nanowires, encapsulated within a layer of metal allowing said first type of electrical contact to be formed;

the second type of electrical contact being situated on the back face of said substrate, opposite to the face comprising said nanowires and being provided by a conducting layer at least facing said first series of nanowires;

characterized in that it comprises the following steps:

the growth of nanowires over the whole surface of a substrate;

the deposition of a conducting layer being transparent at the wavelength of operation of the light-emitting device, on the surface of at least a part of said nanowires;

the local encapsulation by a layer of metal of a sub-set of nanowires constituting said second nanowires, referred to as contact nanowires, allowing said first type of electrical contact to be formed;

the formation of the second type of contact on the back face of the substrate, by a conducting layer at least facing said first series of nanowires.

According to one variant of the invention, the method comprises:

the formation of thick photoresist patterns on the surface of at least two first sub-assemblies of first nanowires leaving at least a second sub-assembly of second nanowires not covered by said photoresist;

the deposition of a layer of metal on the surface of said second nanowires in order to provide the first type of electrical contact;

the removal of said photoresist patterns from said first nanowires.

According to one variant of the invention, the method comprises the deposition of a layer of metal, which may be a metal ink, on the surface of said second nanowires, by a serigraphic process through a mask in order to provide the first type of electrical contact.

According to one variant of the invention, the method comprises a step for formation of conducting lugs on the surface of said layer of metal.

According to one variant of the invention, the method comprises the localized deposition of a layer of metal on the surface of said second nanowires, with a dispenser, in order to provide the first type of electrical contact.

According to one variant of the invention, the method comprises the localized deposition of a layer of metal on the surface of said second nanowires, by inkjet, in order to provide the first type of electrical contact.

According to one variant of the invention, the method comprises a step for removal of the conducting layer which is transparent at the emission wavelength of said light-emitting device from nanowires situated around the periphery of said first and second nanowires, in such a manner as to define a third series of third nanowires.

According to one variant of the invention, the deposition of the layer of metal and/or the formation of the conducting lugs are carried out by an electrodeposition operation.

According to one variant of the invention, the method comprises the deposition of a mirror layer between two adjacent nanowires, said deposition being prior to or after the deposition of said transparent conducting layer.

When the layer of metal is formed by electrodeposition:
according to one variant of the invention, the method comprises the deposition of at least one adhesion layer designed for the adhesion of said metal, where said deposition may be carried out:
  in a continuous manner over all of said nanowires and between two adjacent nanowires on said substrate or;
  in a discontinuous manner at the ends of said nanowires and between two adjacent nanowires on said substrate or;
  between two adjacent nanowires on said substrate;
according to one variant of the invention, the method comprises the deposition of a layer containing copper or aluminum which may advantageously be deposited on a previously deposited thin layer containing titanium;
according to one variant of the invention, the method comprises an operation for removal of said adhesion layer from said third nanowires or from said third nanowires and said first nanowires.

BRIEF DESCRIPTION OF THE DRAWINGS

The invention will be better understood and other advantages will become apparent upon reading the description that follows presented by way of non-limiting example and thanks to the appended figures amongst which:

FIGS. 7a to 7d illustrate the various steps of a second example of a method of fabrication of a light-emitting device of the invention;

FIGS. 8a and 8b illustrate the steps of a third example of a method of fabrication of a light-emitting device of the invention.

DETAILED DESCRIPTION

The light-emitting device of the present invention comprises, generally speaking, a substrate covered with nanowires over the entirety of its surface, in order not to leave open areas in which there could be growth defects during the formation of the nanowires. Thus, according to the invention, even the regions dedicated to the contacts allowing the nanowires to be controlled use the top surface of certain nanowires.

The present invention will be described hereinafter in more detail by virtue of the steps of the method of fabrication allowing the device of the invention to be obtained. The various steps are illustrated by means of FIGS. 4a to 4i.

Figure 1:
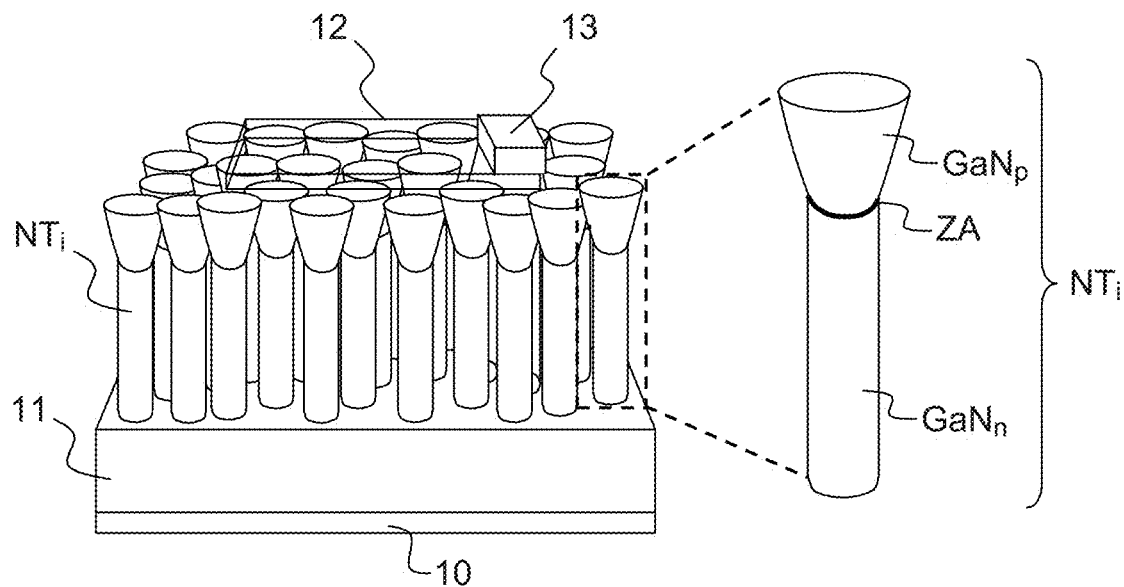
FIG. 1 illustrates a first example of an LED comprising nanowires according to the prior art.
Figure 2:
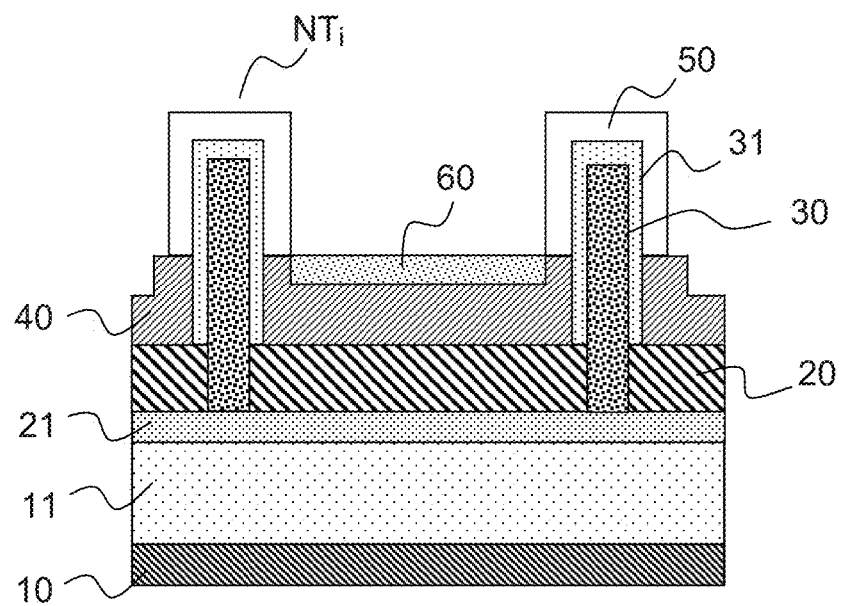
FIG. 2 illustrates a second example of an LED comprising nanowires according to the prior art.
Figure 3:
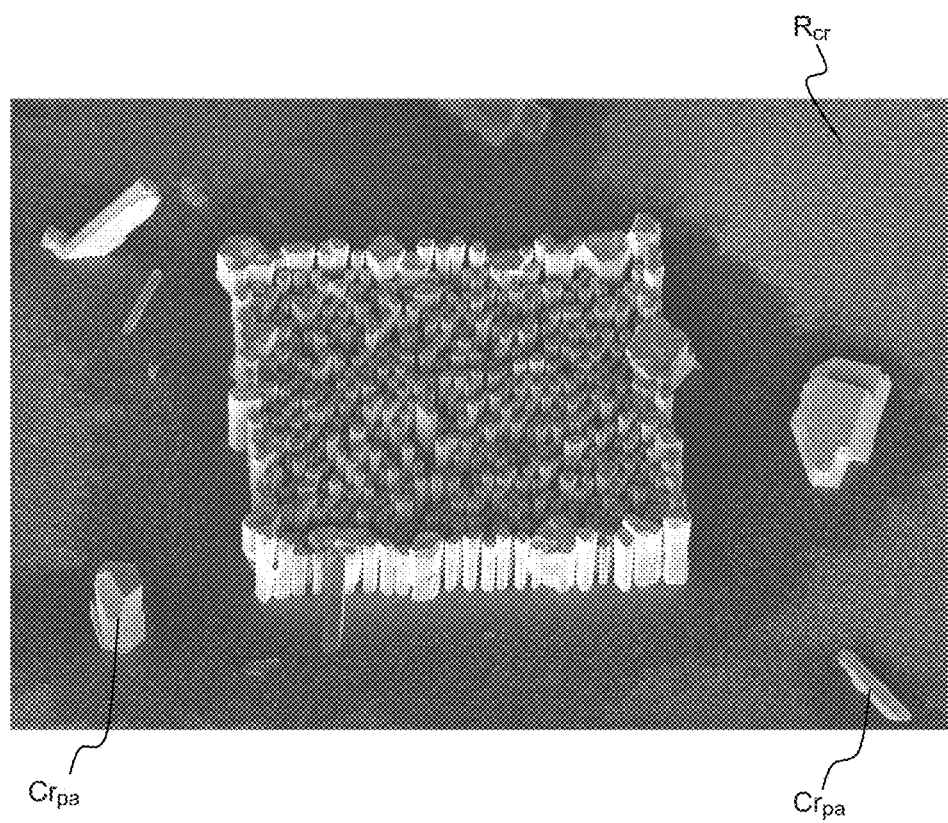
FIG. 3 shows a photograph of a set of nanowires separated by regions without growth in which defects are present in a configuration of the prior art.
Figure 4A:
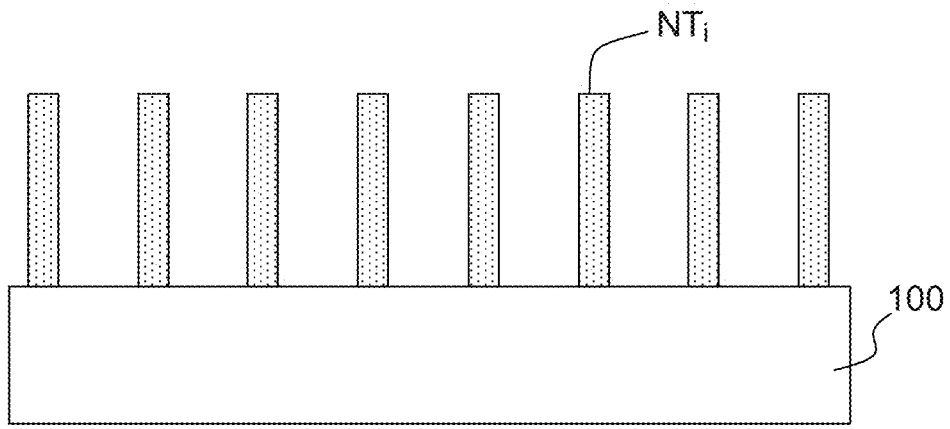
FIGS. 4a to 4i illustrate the various steps of one example of a method of fabrication of a light-emitting device of the invention.

Step 1 Illustrated in FIG. 4a:
Starting from a substrate 100, which can advantageously be made of silicon, the growth of the nanowires $NT_i$, is carried out over the entirety of this substrate.

Figure 4B:
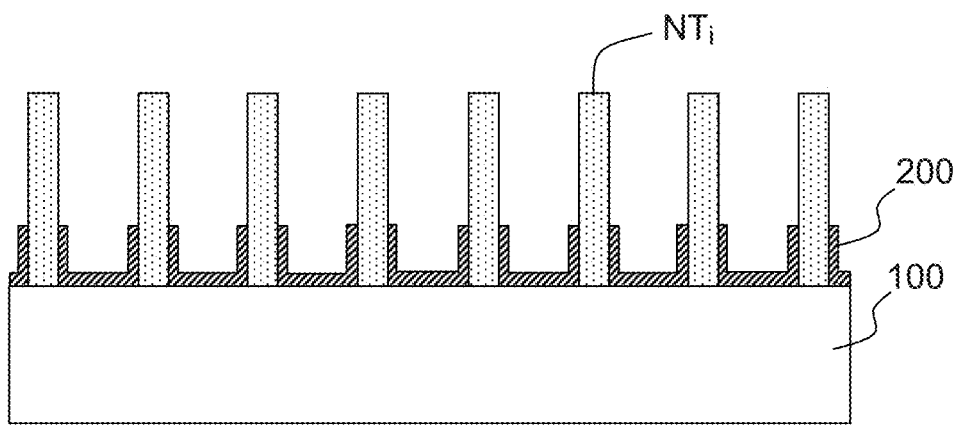

Step 2 Illustrated in FIG. 4b:
The deposition of a layer 200 is then carried out allowing the nanowires to be partially encapsulated, via a dielectric which can typically be $SiO_2$, $Al_2O_3$, $HfO_2$ or $Si_xN_y$, with x and y being molar fractions.

Figure 4C:
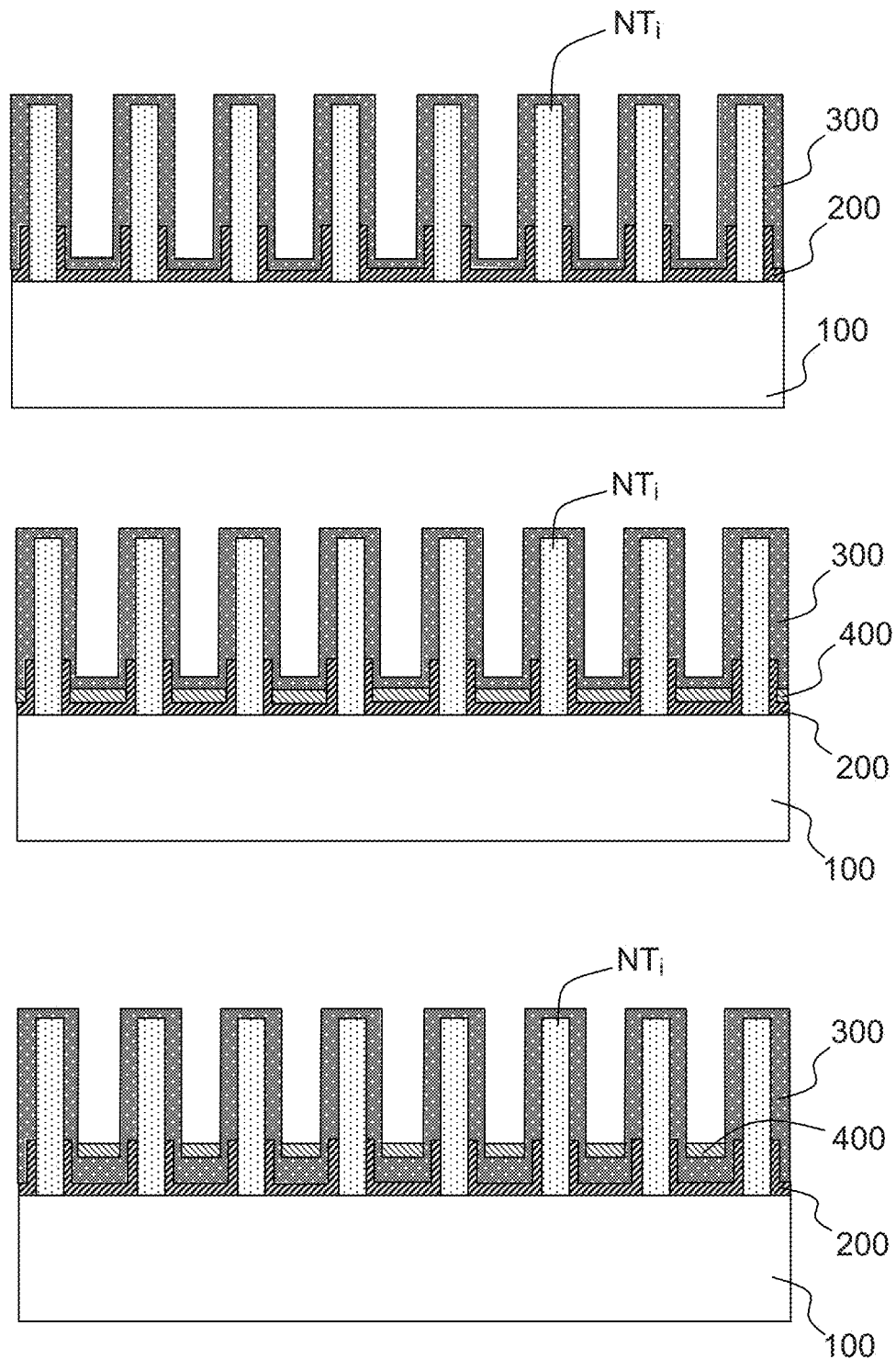

Step 3 Illustrated in FIG. 4c:
The deposition of a conducting layer 300, being transparent at the wavelength of operation of the light-emitting device, is carried out. Typically, this layer may be deposited onto a first layer of nickel, palladium or platinum a few nanometers (5 nm) thick. The transparent conducting layer may be of ITO with a thickness of the order of ten to a hundred nanometers. The transparent conducting layer may equally be of FTO, AZO or GZO.

In order to redirect the beams toward the top of the chip, the deposition of a mirror structure 400 may advantageously also be provided, where this mirror structure may have been deposited prior to the deposition of the transparent conducting layer or afterwards. This mirror structure may be a bi-layer structure of the Ti/Al type or of the Ti/Ag type or of the Ti/Ru type. The various alternatives are shown in FIG. 4c.

Figure 4D:
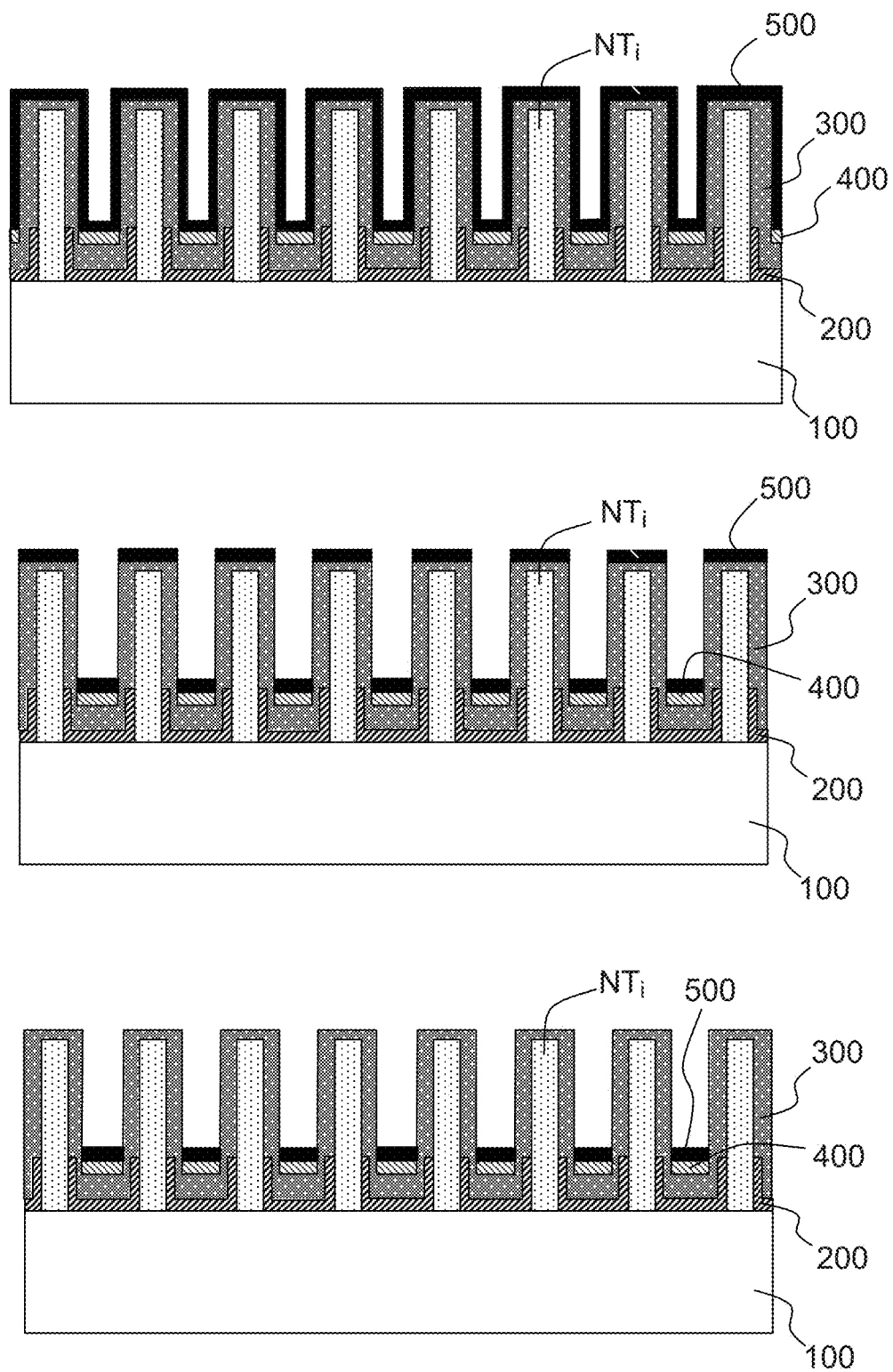

Step 4 Illustrated in FIG. 4d:
The deposition is carried out of a structure 500 of adhesion layer(s) for the thick metal designed to enable the contact to be made. This structure may for example be composed of a first layer of titanium with a thickness of the order of 100 nm and of a layer of copper of the order of 400 nm, and may be obtained by a PVD process. This bi-layer structure may be formed over all of the nanowires and the voids between nanowires, or else in a discontinuous manner. These various possibilities are illustrated in FIG. 4d and may be obtained by adjusting the thicknesses of the bi-layer or by etching.

The bi-layer structures may also be formed by the following depositions: a first layer of TiN or of Ti under a second layer of Cu or of Al using PVD or CVD or evaporation process or sputtering process.

Figure 4E:
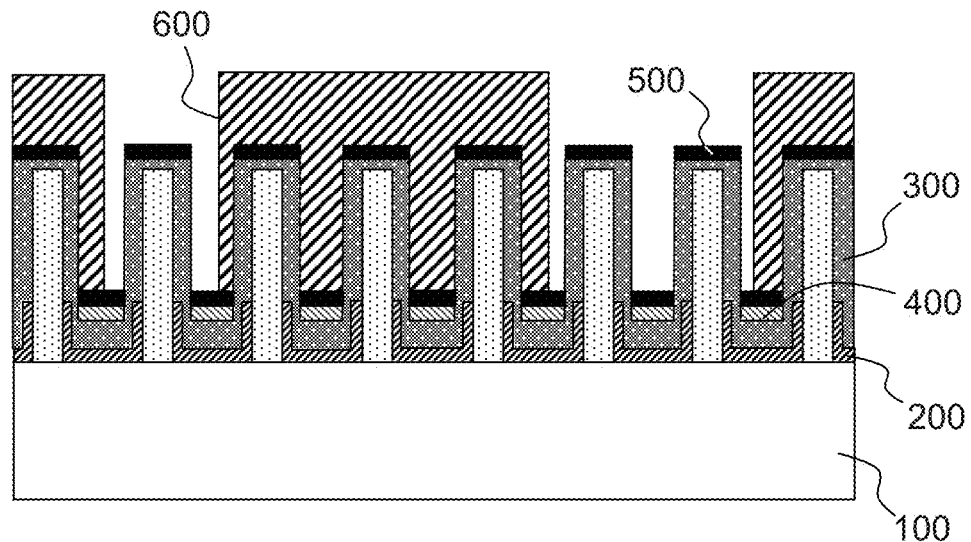

Step 5 Illustrated in FIG. 4e:

A lithography of the photoresist patterns 600 is carried out allowing the later positioning of the upper contacts and thus the active region of the light-emitting device to be defined and at the same time allowing their size to be individualized as described hereinafter.

Figure 4F:
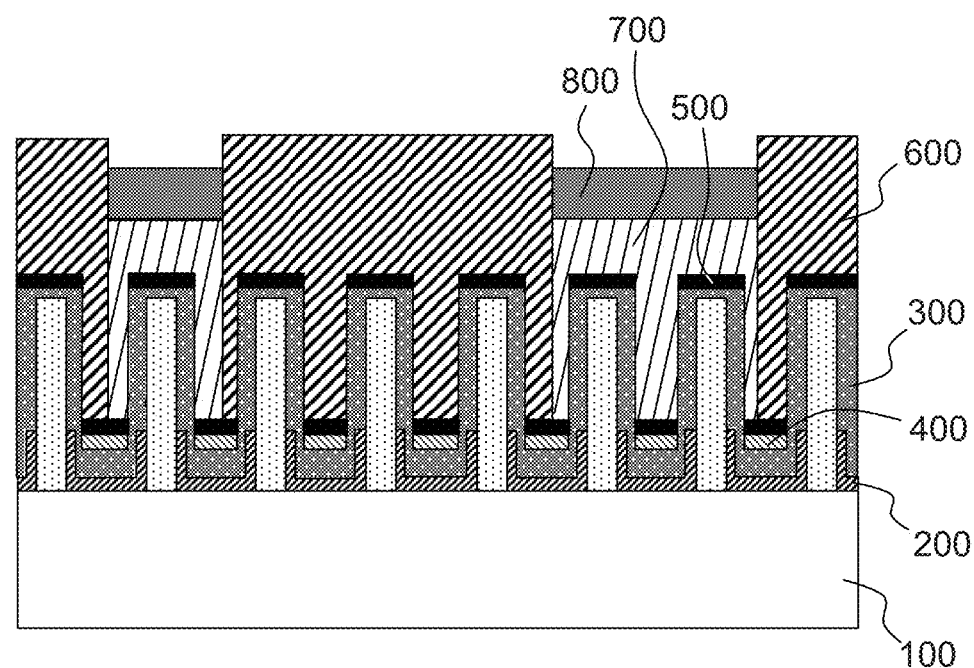

Step 6 Illustrated in FIG. 4f:

The deposition of a thick layer of metal is carried out which can typically have a thickness of around ten nm on top of said nanowires and which can reach several microns, between the photoresist patterns, allowing two series of nanowires to be identified:

- a first series of first nanowires under the photoresist patterns, said photoresist being designed to be removed so as to leave said first nanowires behind;
- a second series of second nanowires under the patterns of thick metal.

The thick layer of metal can typically be made of copper or of nickel and formed by an electrodeposition process.

Bonding lugs 800 can then be formed on this thick layer of metal which are designed to enable the connection with another functionalized support, of the SnAg type for example, which yields the multilayer Cu/Ni/SnAg, followed by an annealing operation at 260° C. These bonding lugs may also be made of Au.

Figure 4G:
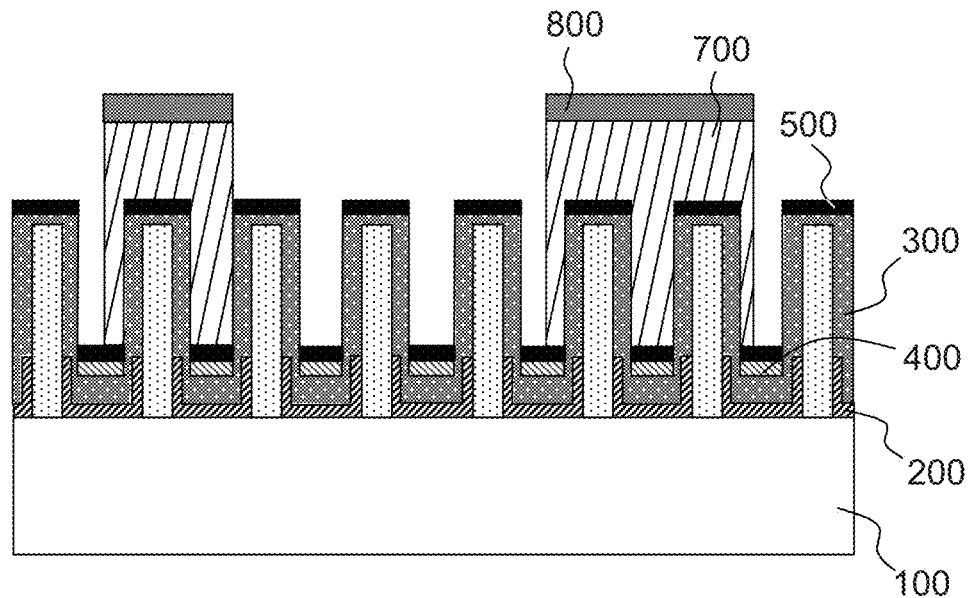

Step 7 Illustrated in FIG. 4g:

The removal of the photoresist patterns is then carried out in such a manner as to leave behind the first nanowires designed to be active.

Figure 4H:
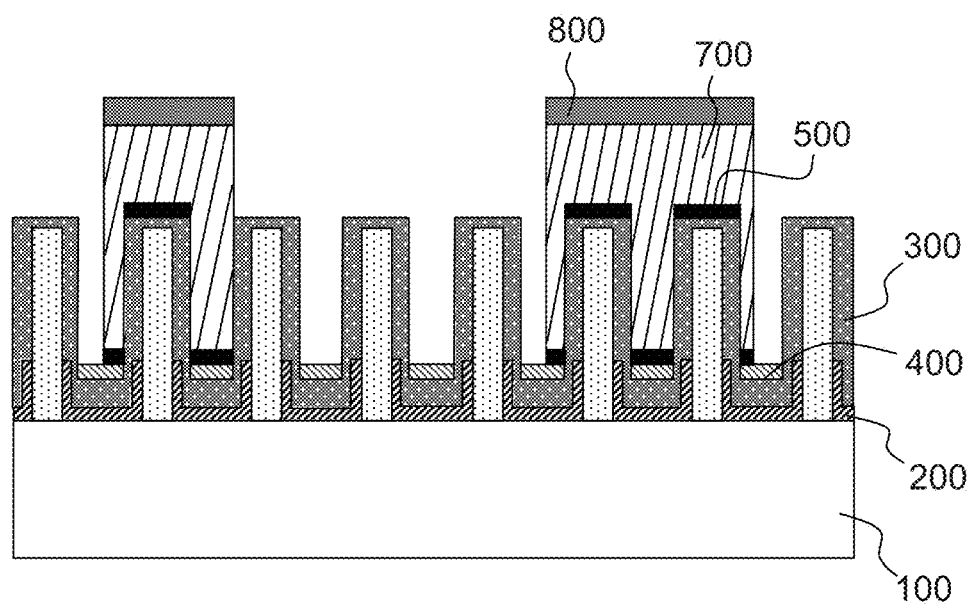

Step 8 Illustrated in FIG. 4h:

Then, in the case of the use of an adhesion structure 500, on the transparent conducting layer 300 or on a mirror structure 400, the selective chemical etching of this structure can be carried out.

It should be noted that, in the case of an adhesion layer made of Ti/Al, this layer may be conserved so as to be used as mirror layer.

Typically, this type of selective etching can be carried out in the pairs: Ti/Cu with respect to ITO or with respect to a mirror structure Ti/Al, by using for example a solution of:

$H_2O_2/H_2SO_4$, in the case of copper;

HF 0.25% in the case of titanium.

The elimination of the adhesion structure may also be carried out by a dry etching operation.

Figure 4I:
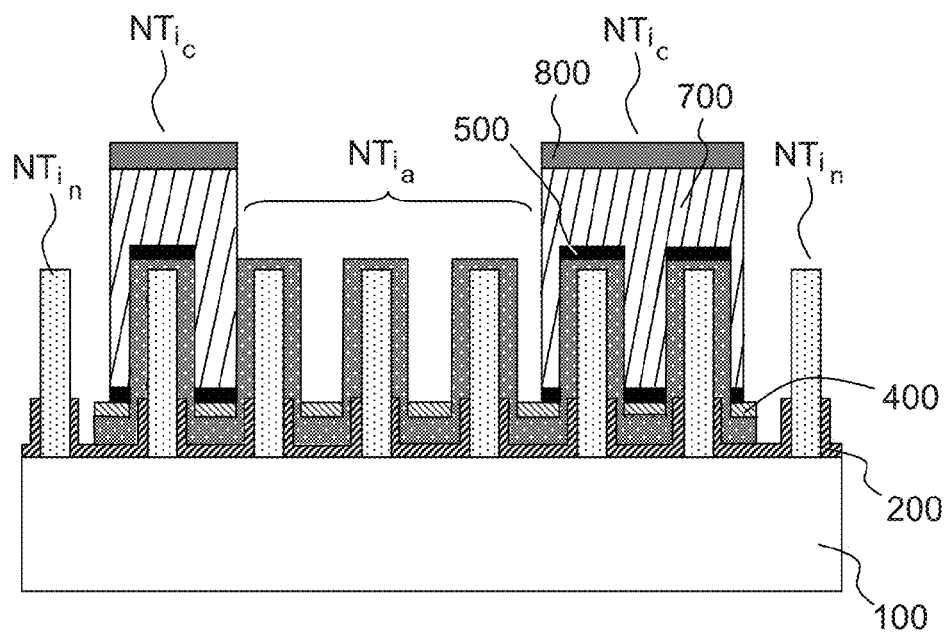

Step 8 Illustrated in FIG. 4i:

Finally, the removal of the transparent conducting layer 300 may advantageously be carried out, around the periphery of the whole set of the first nanowires and of the second nanowires, in such a manner as to circumscribe the active part of the device, neutralizing nanowires, thus defined as being neutral, without having to resort to operations for elimination of these said nanowires.

One example of a device according to the present invention is thus obtained comprising:

- the first series of first nanowires which are exposed and are referred to as active $NTi_a$;
- the second series of second nanowires, under the patterns of thick metal, known as contact nanowires $NTi_c$.
- a third series of third neutral nanowires $NTi_n$, lacking the transparent conducting layer and bounding the light-emitting device part on the substrate having given rise to a global operation for growth of nanowires over the whole surface of said substrate.

As a variant of the method previously described, it is just as possible to envision the formation of the neutral nanowires $NTi_n$ at the start of the method prior to the steps for formation of photoresist patterns, by carrying out the removal of the conducting layer 300 on the nanowires around the periphery.

In the case of the use of an adhesion layer 400 on top of the conducting layer 300, the removal of the two layers around the periphery is then implemented in order to define the nanowires destined to be neutral nanowires.

In the two cases that the layer 300 is on top of or underneath the layer 400, these two layers need to be removed in the region of the neutral nanowires.

Figure 5:
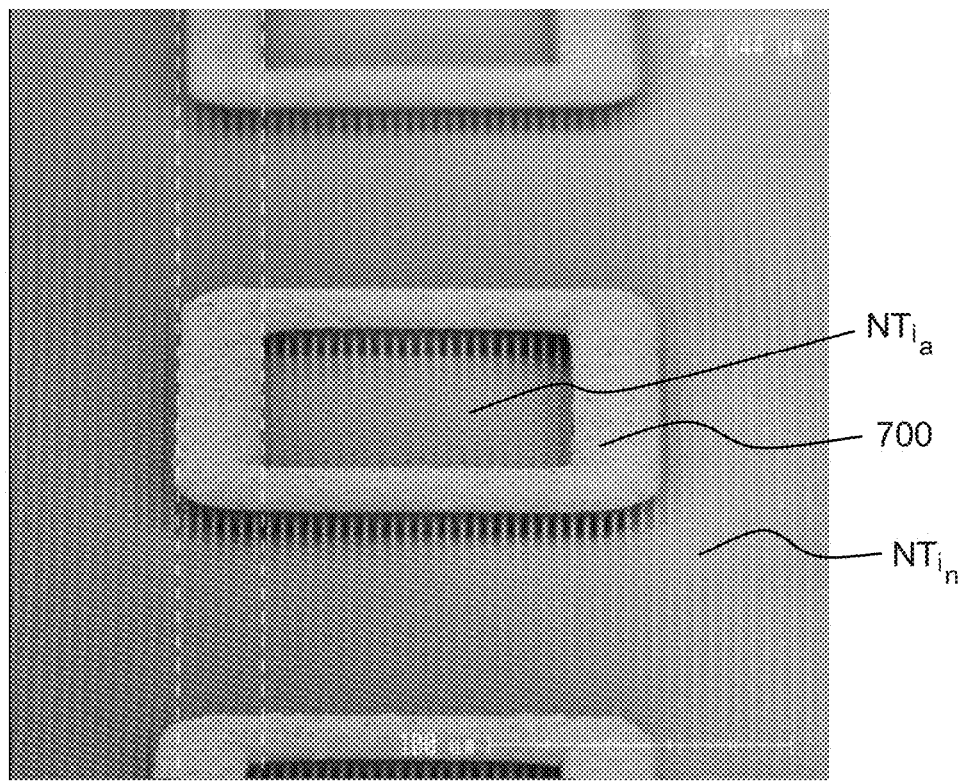
FIG. 5 illustrates one example of configuration of a thick contact layer on the surface of a set of nanowires NTic, situated between first nanowires NTia and third nanowires NTin.

FIG. 5 illustrates a top view of one exemplary configuration of thick contact layer 700 on the surface of a set of nanowires $NTi_c$ situated between first nanowires $NTi_a$ and third nanowires $NTi_n$.

Generally speaking, the second type of contact for controlling the light-emitting device is on the back face. This may typically be a layer of metal deposited on the back face of the substrate which can be advantageously made of silicon.

Figure 6:
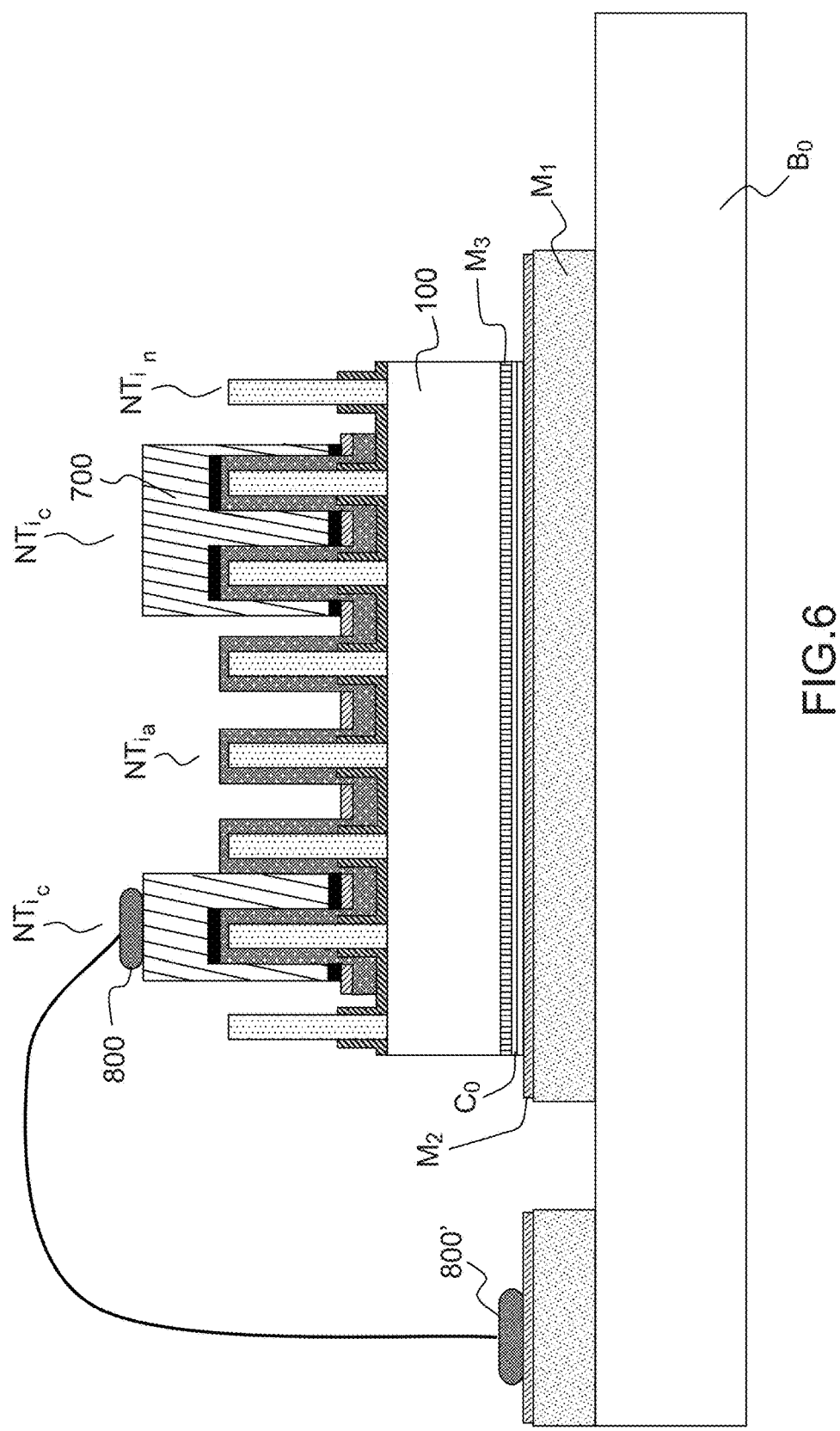
FIG. 6 illustrates an overall view of one example of a device according to the invention mounted onto a housing.

FIG. 6 shows schematically the mounting of one example of a device according to the invention onto a housing, and the electrical connection from the two types of contact: p contact and n contact. The p contact is provided from the $NTi_c$ and the contact lugs 800 and 800'. The housing $B_o$ is covered with a layer of metal $M_1$ which can be of copper, with a thin metal layer $M_2$ which may typically be a flash of gold, said housing thus being rigidly attached to the light-emitting device on the back face via the substrate comprising a metal layer $M_3$ which can typically be based on Ti/Au and providing the contact of the n type, via an intermediate layer which may be a Co bonding layer.

It should be noted that the bonding lugs can have smaller lateral dimensions and may not occupy the whole top surface of the patterns of thick metal 700, such as the bonding lugs 800 effectively shown in FIG. 6.

Second Example of a Method of Fabrication of a Light-Emitting Device of the Invention It is also advantageously possible to form the contacts by metal deposition using a serigraphic process. FIGS. 7a to 7d illustrate the main steps of this type of process, which only shows the formation of a single sub-assembly of contact nanowires $NTi_c$, even if the nanowires $NTi_a$ may advantageously be included between two sub-assemblies of nanowires $NTi_c$.

The first steps may be identical to those described in FIGS. 4a and 4c.

Starting from a substrate 100 comprising nanowires NTi covered by a transparent conducting layer 300 and locally by a mirror layer 400 as illustrated in FIG. 7a, a mask M comprising openings is placed facing the nanowires designed to form the contact nanowires, as illustrated in FIG. 7b.

Through said mask M, the deposition of a metal ink E is carried out which can typically be of silver, as illustrated in FIG. 7c. Subsequently, the thickness of the metal contacts thus formed is made uniform by means of a scraper R, as illustrated in FIG. 7d, and the contact nanowires $NTi_c$ are thus defined, covered by a thick metal layer, contiguous with the active nanowires $NTi_a$.

In an analogous manner to what is shown in FIG. 4i, but not shown in the present example, it is advantageously possible to proceed with the removal of the transparent conducting layer 300 and of the mirror layer 400, around the periphery of the whole set of the first nanowires and of the second nanowires, in such a manner as to circumscribe the active part of the device, neutralizing nanowires, thus defined as being neutral, without having to resort to operations for elimination of these said nanowires.

According to this method, the electrical connection (bonding) with another metalized support, from the first contact thick layer, can be formed directly.

Third Example of a Method of Fabrication of a Light-Emitting Device of the Invention It is furthermore advantageously possible to form the contacts by localized deposition of metal using a dispenser. FIGS. 8a and 8b illustrate this third example of a method of fabrication of a light-emitting device of the invention which only shows the formation of a single sub-assembly of contact nanowires $NTi_c$, even if the nanowires $NTi_a$ may advantageously be included between two sub-assemblies of nanowires $NTi_c$.

The first steps can be identical to those described in FIGS. 4a and 4c.

Starting from a substrate 100 comprising nanowires NTi covered by a transparent conducting layer 300 and locally by a mirror layer 400, the localized deposition of a drop of metal G is carried out by means of a dispenser D, as illustrated in FIG. 8a. The dispenser D may typically be a syringe. This metal deposition thus forms the contacts on the contact nanowires $NTi_c$ contiguous with the active nanowires $NTi_a$, as illustrated in FIG. 8b. In an analogous manner to what is shown in FIG. 4i, but not shown in the present example, it is advantageously possible to proceed with the removal of the transparent conducting layer 300 and of the mirror layer 400 around the periphery of the whole set of the first nanowires and of the second nanowires, in such a manner as to circumscribe the active part of the device, neutralizing nanowires, thus defined as being neutral, without having to resort to operations for elimination of these said nanowires.

According to this method, the electrical connection (bonding) with another metalized support, from the first contact thick layer, can be formed directly.

Fourth Example of a Method of Fabrication of a Light-Emitting Device of the Invention It is yet again advantageously possible to form the contacts by localized deposition of metal using an inkjet process.

Thus, according to the present invention, the size of the LEDs becomes customizable, by virtue of the positioning of the regions of thick metal, and this may be carried out advantageously fairly late in the process steps.

Beyond the non-deterioration of certain nanowires, by removal operations, a gain in the number of process steps may be made (notably all the steps required in the case of elimination of nanowires).

It is also advantageously possible to position intermediate upper contacts in the center of large matrices, while at the same time benefiting from the possibility of electrodepositing bonding lugs following the formation of the thick metal contact layer.

Lastly, it should be noted that the principle of the present invention allows devices to be fabricated at a particularly advantageous cost.

The invention claimed is:

1. A light-emitting device comprising a set of nanowires over the whole surface of a substrate, comprising:
   a first series of first nanowires; and
   a second series of second nanowires;
   said first series comprising first nanowires being active capable of emitting light under electrical control, connected between a first type of electrical contact and a second type of electrical contact in order to avow said device to emit light under electrical control, said first nanowires being covered by at least one conducting layer being transparent at an emission wavelength of said light-emitting device, said layer being in contact with said first type of electrical contact;
   said second series of second nanowires being contact nanowires connected to said first type of electrical contact;
   said first type of electrical contact comprising sequentially:
     said at least one conductor layer deposited on the second nanowires;
     an adhesion layer wherein the adhesion layer is deposited on and in contact with a portion of the at least one conducting layer in contact with the second nanowires;
     a layer of metal, encapsulating the second series so that the layer of metal is deposited on both the adhesion layer and another portion of the at least one conducting layer which is in contact with the second nanowires but not with the adhesion layer, and allowing said first type of electrical contact to be formed, the layer of metal not encapsulating the first nanowires; and
     a contact lug, wherein the contact lug is deposited on and in contact with the layer of metal which is in contact with the adhesion layer,
   the second type of electrical contact being situated on the back face of said substrate, opposite to the face comprising said nanowires and being provided by another conducting layer facing at least said first series of nanowires.

2. The light-emitting device as claimed in claim 1, wherein said second nanowires are situated around the periphery of said first nanowires.

3. The light-emitting device as claimed in claim 1, comprising a third series of third nanowires being electrically neutral without a conducting layer being transparent at the emission wavelength of said light-emitting device, said third nanowires being able to be situated around the periphery of said first active nanowires and of said second nanowires, defining a region of said device said to be active.

4. The light-emitting device as claimed in claim 1, wherein the thickness of the layer of metal defined on top of said second nanowires is at least ten nanometers and in that the metal layer encapsulating said second nanowires is made of copper or of nickel or of silver.

5. The light-emitting device as claimed in claim 1, comprising a mirror layer situated between two adjacent nanowires, which layer comprises at least one of Al, Ag and Ru.

6. The light-emitting device as claimed in claim 1, wherein the contact lug comprises at least one of gold and an alloy of silver and tin.

7. The light-emitting device as claimed in claim 1, wherein said adhesion layer is discontinuous and comprises at least one of copper and aluminum.

8. A method for the fabrication of a light-emitting device, wherein the light-emitting device comprising:
   a set of nanowires over the entire surface of a substrate;
   at least a first series of first nanowires and a second series of second nanowires;
   said first series comprising first nanowires being active capable of emitting light under electrical control, connected between a first type of electrical contact and a second type of electrical contact in order to allow said device to emit light under electrical control, said first nanowires being covered by at least one first conducting layer being transparent at the emission wavelength of said light emitting device, said layer being in contact with said first type of electrical contact;

said second series of second nanowires being contact nanowires connected to said first type of electrical contact;

said first type of electrical contact comprising sequentially:
  said at least one conductor layer deposited on the second nanowires;
  an adhesion layer wherein the adhesion layer is deposited on and in contact with a portion of the at least one first conducting layer in contact with the second nanowires;
  a layer of metal, encapsulating the second series so that the layer of metal is deposited on both the adhesion layer and another portion of the at least one first conducting layer which is in contact with the second nanowires but not with the adhesion layer, and allowing said first type of electrical contact to be formed, the layer of metal not encapsulating the first nanowires; and
  a contact lug, wherein the contact lug is deposited on and in contact with the layer of metal which is in contact with the adhesion layer, the second type of electrical contact being situated on the back face of said substrate, opposite to the face comprising said nanowires, and being provided by another conducting layer at least facing said first series of nanowires, the method comprising carrying out the following steps:
growth of the set of nanowires over the whole surface of said substrate;
deposition of said first conducting layer;
local encapsulation of said second nanowires by said layer of metal;
formation of the second type of contact on the back face of the substrate, by said another conducting layer.

9. The method of fabrication of light-emitting devices as claimed in claim 8, comprising:
  formation of thick photoresist patterns on the surface of said first nanowires leaving said second nanowires not covered by said photoresist;
  deposition of said layer of metal on the surface of said second nanowires in order to provide the first type of electrical contact;
  removal of said photoresist patterns from said first nanowires.

10. The method of fabrication of light-emitting devices as claimed in claim 9, comprising formation of the contact lug, wherein the deposition of the layer of metal and/or the formation of the contact lug are carried out by an electrodeposition operation.

11. The method of fabrication of light-emitting devices as claimed in claim 8, comprising a step for removal of the first conducting layer which is transparent at the emission wavelength of said light-emitting device from nanowires situated around the periphery of said first and second nanowires, in such a manner as to define a third series of third nanowires.

12. The method of fabrication of light-emitting devices as claimed in claim 11, comprising deposition of said adhesion layer designed for the adhesion of said layer of metal, said deposition being able to be implemented:
  in a discontinuous manner at the ends of said nanowires and between two adjacent nanowires onto said substrate or;
  between two adjacent nanowires onto said substrate.

13. The method of fabric of light-emitting device as claimed in claim 12, comprising an operation for removal of said adhesion layer from said third nanowire or from said third nanowires and said first nanowires.

14. The method of fabrication of light-emitting devices as claimed in claim 8, comprising the deposition of a mirror layer between two adjacent nanowires, said deposition being prior to or after the deposition of said transparent first conducting layer.

* * * * *

UNITED STATES PATENT AND TRADEMARK OFFICE
CERTIFICATE OF CORRECTION

PATENT NO. : 10,453,991 B2
APPLICATION NO. : 14/780545
DATED : October 22, 2019
INVENTOR(S) : Sylvia Scaringella et al.

Page 1 of 1

It is certified that error appears in the above-identified patent and that said Letters Patent is hereby corrected as shown below:

In the Claims

Claim 1, Column 9, Line 67 "in order to avow said" should read -- in order to allow said --.

Signed and Sealed this
Tenth Day of December, 2019

Andrei Iancu
*Director of the United States Patent and Trademark Office*